(12) United States Patent
Archer et al.

(10) Patent No.: US 7,253,387 B2
(45) Date of Patent: Aug. 7, 2007

(54) LIST MODE MULTICHANNEL ANALYZER

(75) Inventors: Daniel E. Archer, Livermore, CA (US); S. John Luke, Pleasanton, CA (US); G. Joseph Mauger, Livermore, CA (US); Vincent J. Riot, Berkeley, CA (US); David A. Knapp, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/979,592

(22) Filed: Nov. 1, 2004

(65) Prior Publication Data
US 2005/0094466 A1 May 5, 2005

Related U.S. Application Data

(60) Provisional application No. 60/516,129, filed on Oct. 31, 2003.

(51) Int. Cl.
H01J 40/14 (2006.01)
G01J 1/44 (2006.01)

(52) U.S. Cl. .................. 250/207; 250/214 R

(58) Field of Classification Search ............ 250/207, 250/214 DC, 214 R, 214 VT; 313/528, 532, 313/103 R, 103 CM
See application file for complete search history.

(56) References Cited

U.S. PATENT DOCUMENTS

| | | | |
|---|---|---|---|
| 3,943,021 A * | 3/1976 | Lindsey ................... 156/180 |
| 5,285,072 A * | 2/1994 | Klingenbeck-Regn et al. ................... 250/369 |
| 5,532,944 A | 7/1996 | Battista |
| 5,689,115 A * | 11/1997 | Balan et al. ........... 250/363.07 |
| 5,722,405 A | 3/1998 | Goldberg |
| 5,777,333 A | 7/1998 | Pierangelo et al. |
| 6,194,715 B1 * | 2/2001 | Lingren et al. .......... 250/252.1 |
| 6,279,146 B1 * | 8/2001 | Evans et al. .................. 716/18 |
| 6,342,701 B1 | 1/2002 | Kash |
| 6,541,763 B2 | 4/2003 | Lingren et al. |
| 6,552,348 B2 | 4/2003 | Cherry et al. |
| 6,573,762 B1 | 6/2003 | Wessendorf et al. |
| 6,605,809 B1 * | 8/2003 | Engels et al. ................ 250/394 |
| 6,628,984 B2 | 9/2003 | Weinberg |
| 2004/0017224 A1 * | 1/2004 | Tumer et al. .................. 327/51 |
| 2006/0180767 A1 * | 8/2006 | Ramsden ..................... 250/369 |

* cited by examiner

Primary Examiner—Que Tan Le
Assistant Examiner—Pascal M. Bui-Pho
(74) Attorney, Agent, or Firm—James S. Tak; John H. Lee

(57) ABSTRACT

A digital list mode multichannel analyzer (MCA) built around a programmable FPGA device for onboard data analysis and on-the-fly modification of system detection/operating parameters, and capable of collecting and processing data in very small time bins (<1 millisecond) when used in histogramming mode, or in list mode as a list mode MCA.

23 Claims, 8 Drawing Sheets ial application
filed on Oct. 31, 2003, entitled "List Mode MCA" Ser. No.
60/516,129, by inventors Daniel E. Archer et al.

LIST MODE MULTICHANNEL ANALYZER

I. CLAIM OF PRIORITY IN PROVISIONAL APPLICATION

This application claims priority in provisional application filed on Oct. 31, 2003, entitled "List Mode MCA" Ser. No. 60/516,129, by inventors Daniel E. Archer et al.

The United States Government has rights in this invention pursuant to Contract No. W-7405-ENG-48 between the United States Department of Energy and the University of California for the operation of Lawrence Livermore National Laboratory.

II. FIELD OF THE INVENTION

The present invention relates to data acquisition systems, such as multi-channel analyzers (MCA). More particularly, the present invention relates to a field-portable list-mode MCA for use in a radiation detector and capable of collecting data as single photon counts in list-mode operation, or in very small, variable, time bins (e.g. <1 millisecond) in spectral histogram mode, or both, wherein the MCA includes a programmable FPGA for onboard data analysis and on-the-fly modification of system detection/operating parameters.

III. BACKGROUND OF THE INVENTION

Analog radiation detectors, and in particular analog MCAs, have typically enabled users to record spectral data in time bins of not less than 1 second. This is often inadequate, however, for detection scenarios where a moving radioactive source is involved and the data acquisition window for collecting the majority data is a very short period of time. Especially at road speeds, such sources may come into "view" (i.e. high percentile detection range) only for a fraction of a second. For example, a radioactive source passing by at 65 mph with a closest approach to the detector of 3 meters, 80 percent of the radiation collected from the pass by will be collected in less than 0.5 seconds. Using 1 second time bins in these types of cases would average out many if not most features/events in the spectral data, and lose other details which would have otherwise provided valuable information as to the nature of the source and its movement. For example, signal fluctuations from the detector would not be easily scrutinizable for determining whether or not they are simply statistical fluctuations in the background or actual changes in the background due to a real radioactive source. Moreover, statistical fluctuations and non-uniform time bins due to MCA deficiencies can cause raggedness in the spectral data.

There is therefore a need for a fast MCA unit for use in a radiation detector (e.g. NaI detector), and capable of collecting and analyzing gamma radiation spectral data from a moving radioactive source in histogram mode, using very small time bins of preferably less than 1 millisecond, or list mode, or both, for high time resolution. In addition, it would be advantageous to provide a programmable MCA which may be specifically configured for various types of radiation detectors, and various operating parameters and detection modalities. Furthermore, it would also be advantageous to provide such a list mode MCA that is small, low power, self-contained, field-portable, field-programmable, and capable of providing real-time onboard data analysis.

IV. SUMMARY OF THE INVENTION

One aspect of the present invention includes a list mode multichannel analyzer (MCA) for collecting and analyzing radiation data, comprising: a power module electrically connected to supply power to a PMT and a radiation detector; an analog chain module including a preamplifier electrically connected to the PMT to receive, integrate, and shape charges collected at the PMT, and digitize the data; and a processor/controller module comprising an integrated programmable FPGA electrically connected to the analog chain module for receiving the digitized data, and an integrated controller interface capable of enabling a user to variably program said FPGA with a data processing preference of either list mode or histogram mode.

Another aspect of the present invention includes a list mode multichannel analyzer (MCA) comprising: a power module electrically connected to supply power to a PMT and a radiation detector; and a processor/controller module comprising an integrated FPGA electrically connected to the analog chain module for receiving the digitized data, a digital data input means for receiving digital data to be communicated directly to the FPGA, and an integrated controller interface enabling a user to variably program said FPGA with a data processing preference of either list mode or histogram mode.

V. BRIEF DESCRIPTION OF THE DRAWINGS

The accompanying drawings, which are incorporated into and form a part of the disclosure, are as follows.

VI. DETAILED DESCRIPTION

Generally, the present invention is directed to a small, field-portable, and flexibly configurable/programmable list mode MCA for use in radiation detectors, such as for example NaI(T1) and plastic detectors, which collects, analyzes and communicates data to a host computer and ultimately to an end user. While the MCA is used as a hardware subcomponent of a radiation detector system, which typically also includes a detection material radiation detector (e.g. NaI crystal, scintillator, or the like) and a photomultiplier tube (PMT), the MCA is self-contained with its own integrated high voltage supply and preamplifier, as well as an onboard FPGA which can be programmed/re-programmed to allow a user to set or modify operating and/or detecting parameters of the radiation detector. In particular, the MCA is designed to allow a user to program, for example, the detector type, data output preference, data processing preference (list mode or histogram mode), trigger algorithm preference, etc. in order to optimize the analytical functionality, with user programming possible over any real-time based operating environment, including UNIX and Windows platforms. Moreover, the MCA is designed to enable on-the-fly, in-system programming/re-programming to improve and fine tune operating/detection performance without any dead time, i.e. continuous data acquisition.

An important attribute of the list mode MCA of the present invention is its capacity to collect and analyze data in either list mode, spectral histogram mode, or both. "List mode," also known as "event mode," is defined as raw signal strength and spectral data of an individual photon event correlated with an event time. Operating in list mode, the MCA is capable of reporting individual gamma energies and corresponding event times of the energy depositions. This preserves the data in the most flexible manner so that it can be analyzed in an optimal way for a particular system in which it is being used, i.e. a user can re-bin the data with the most appropriate time bin structure for any geometry of source/detector. And in histogram mode, spectral data is collected and histogrammed by energy in very small, user-customizable time bins, preferably less than 1 millisecond wide, and having a uniform time bin structure. Flexibility in detection mode/scheme selection enables the MCA to be used in low to high rate counting environments, while preserving resolution of the detection material (e.g. NaI crystal). Each detection scheme of the MCA of the present invention has its advantages, depending on data rates and processing power available, and thus allows the user to collect data in the most flexible architecture possible with the highest signal to background, which directly influence the level of sensitivity of the instrument. It also enables and supports continuous acquisition with no dead time due to data transmission bottlenecking.

Figure 1:
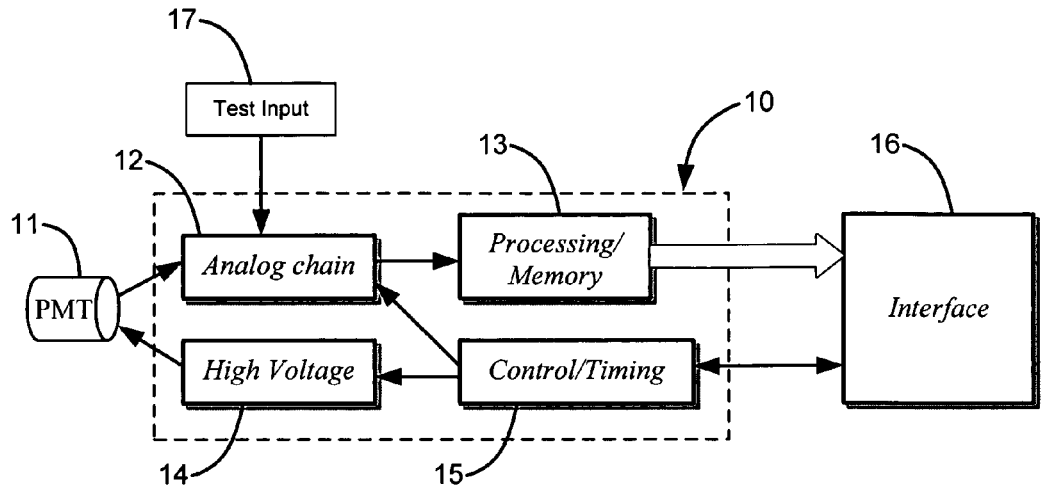
FIG. 1 is a schematic diagram of the list mode MCA of the present invention showing the operational flow between the main functional components.

Turning now to the drawings, FIG. 1 shows a schematic diagram of the general architecture and operational flow (indicated by arrows) of the list mode MCA, generally indicated at 10, and including four major functional blocks: an analog chain block 12, a processing/memory block 13, a high voltage block 14, and a control/timing block 15. Generally, the analog chain block 12 integrates and shapes the charges collected at the PMT 11 of a radiation detector (not shown). The various values are then stored in memory at the processing/memory block 13 as histograms that are changed as time goes by, or as raw data with timestamp in list mode, depending on which modality is chosen by a user. Once enough data is stored, by a pre-determined limit, it is transferred through the interface 16 and out to, for example, a host computer (e.g. laptop) where the results may be viewed and monitored by a user. Additionally, the processing block 13 may also implement a triggering algorithm to trigger some form of automatic notification/reporting, making the system a standalone instrument (i.e. performing detection, analysis, and identification/alarm). And the control/timing block 15 includes control logic which enables user-programming of the various configurable parameters, and also handles the various timing operations. And the high voltage block 14 handles the bias used for the PMT 11, which can be a digitally controlled programmable high voltage, such as from 0 to 1500 Volts. A test input 17 may be utilized at the analog chain 12 to allow a user to debug electronics and calibrate the system. In particular, the test input 17 allows testing of the preamplifer (51 in FIG. 4) of the analog chain with a known pulser.

Figure 2:
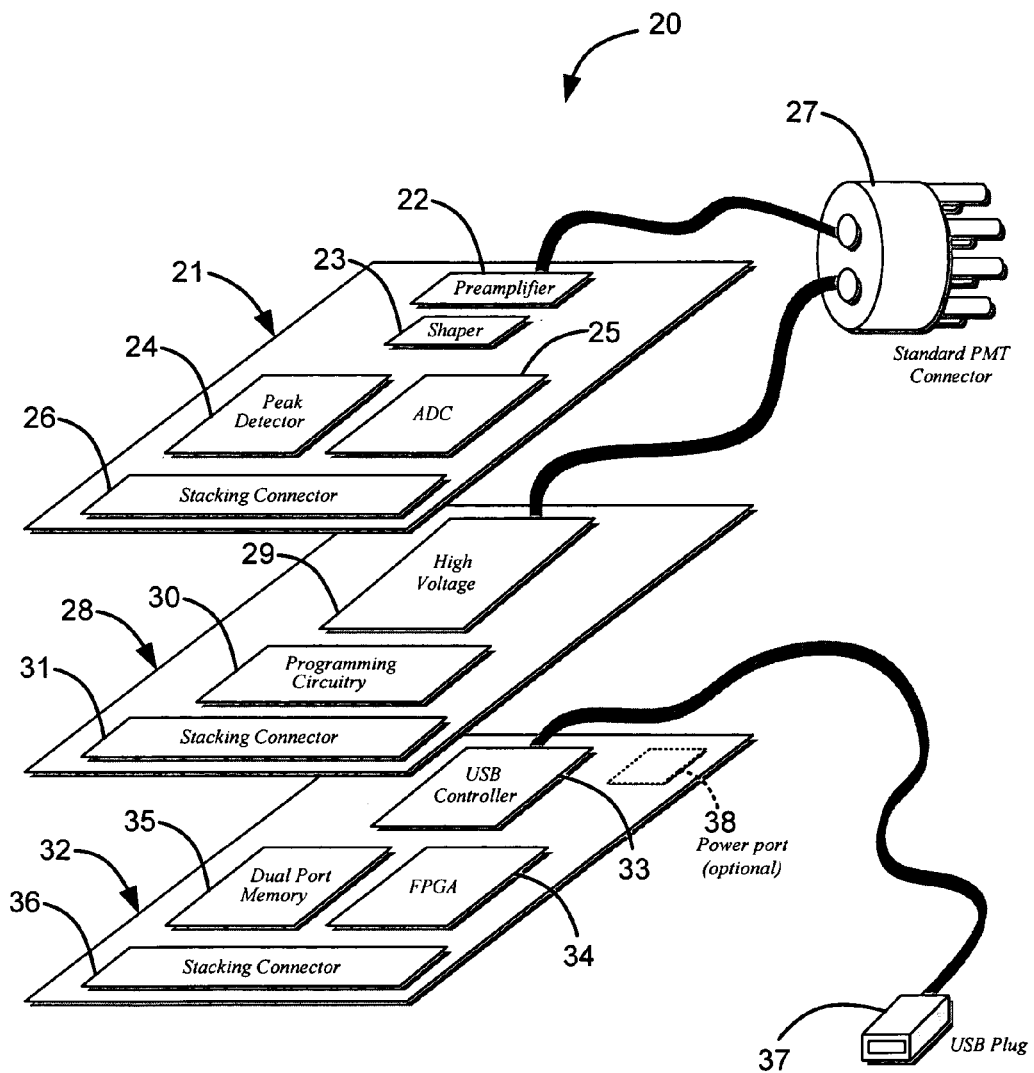
FIG. 2 is an exploded perspective view of a first exemplary structural configuration of the present invention.

FIG. 2 shows an exploded view of a first exemplary structural embodiment of the list mode MCA, generally indicated at reference character 20. The MCA has a modular, multi-board construction to achieve fast development and flexible design. In particular, the MCA 20 in FIG. 2 is shown having three independent modules including an analog chain module 21, a high voltage power module 28, and a core onboard processor/controller module 32. The three modules 21, 28, and 32 are shown arranged in a stacked arrangement for a reduced form-factor, using stacking connectors 26, 31, and 36 which are suitably adapted to connect to an adjacent stacking connector. Data communication between the three modules is enabled by data busses preferably located through the stacking connectors 26, 31 and 36. It is appreciated that the modularity of the three modules 21, 28 and 32 enables any one to be easily removed and replaced (swappable) as needed. For example, where different detector types require different power configurations particularly designed for a detector type, the power module 28 may be swapped out for another differently configured power module while keeping the other two modules. Each module is preferably constructed from printed circuit board (PCB) and having electronic components integrated thereon. And noise reduction in each of the modules may be achieved using multiple layers of PCB, such as at least four layers.

Generally, the analog chain module 21 of FIG. 2 implements the analog chain block 12 of FIG. 1 and is shown having a preamplifier 22, a shaper 23, a peak detector 24 and an analog-to-digital converter (ADC) 25. The power module 28 implements the high voltage block 14 of FIG. 1, and is shown having an integrated high voltage power supply 29 and programming circuitry 30 for digitally programming the high voltage power supply with a desired bias. And the processor/controller module 32 implements the interface and memory/processing 13 and control/timing 15 blocks of FIG. 1. The processor/controller module is shown having a USB controller 33, a FPGA 34 (field programmable gate array), and a dual port memory 35. The USB controller 33 is capable of interfacing with a host computer (not shown) via a USB cable and plug 37, which may be integrally provided with the USB controller, or separately attachable thereto. Power is preferably supplied to the high voltage power supply 29 through the USB plug 37 and USB controller 33. In addition, power may also be supplementally or alternatively supplied via an independent external power supply, routed directly onto the processor/controller module 32, as shown at 38. And a PMT connector 27 is shown electrically connected to the preamplifier 22 on the analog chain module 21 to transmit detected signals thereto. The PMT connecter 14 is also connected to the high voltage power supply 29 of the high voltage board 12 to receive power for the PMT and the radiation detector. Preferably, a standard 14-pin PMT connector is utilized so that it can be tested with standard NaI detectors. And it is appreciated that the PMT connecter 14 may be provided as an integrated component of the MCA, or in the alternative, independently connectable to the respective preamplifier 22 and high voltage power supply 29.

Figure 3:
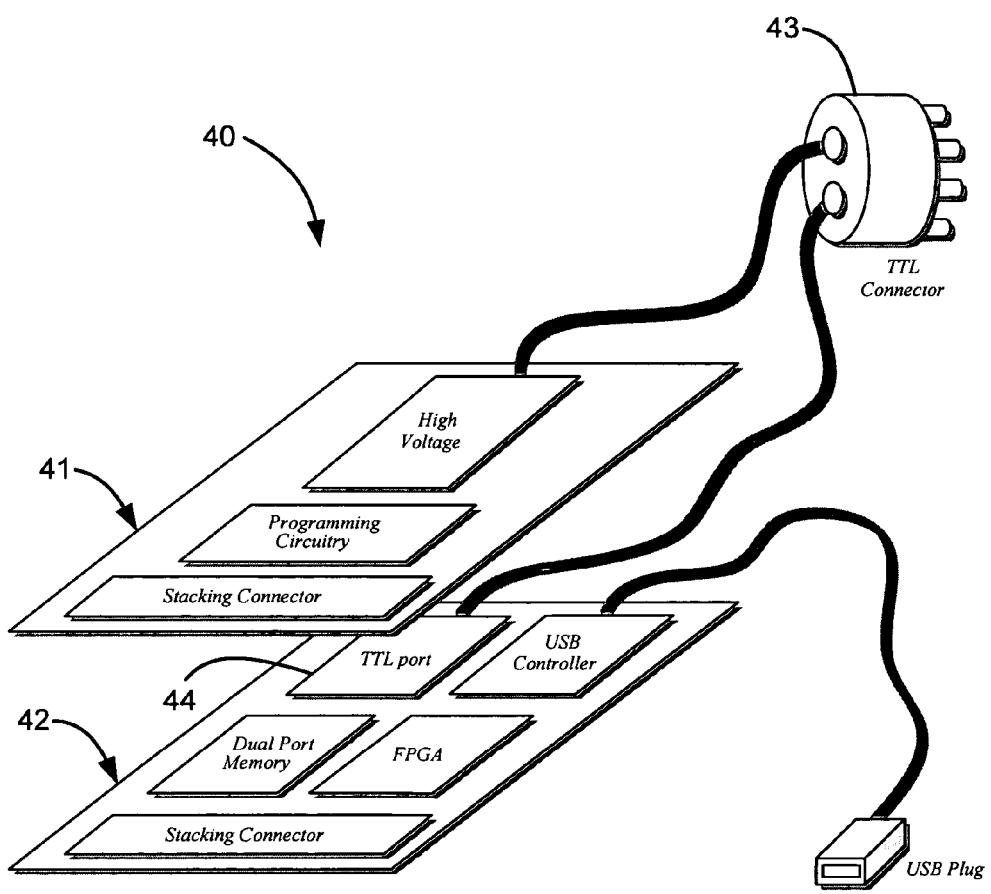
FIG. 3 is an exploded perspective view of a second exemplary structural configuration of the present invention.

FIG. 3 shows an exploded view of a second exemplary structural embodiment of the list mode MCA, indicated at reference character 40. In this embodiment, a TTL input port 44 is provided on the processor/controller module so as to provide, for example, neutron detector support. In contrast to FIG. 2, MCA 40 is shown having only two modules, a high voltage power module 41 and a processor/controller module 42, without a separate analog chain module. It is appreciated that an analog chain module/block is not required in this case since a TTL input port 44 is configured to receive already digitized data from a TTL connector 43, and therefore can communicate directly with the FPGA. TTL, i.e. transistor-transistor logic, is a common semiconductor technology known in the art for building discrete digital logic integrated circuits.

Figure 4:
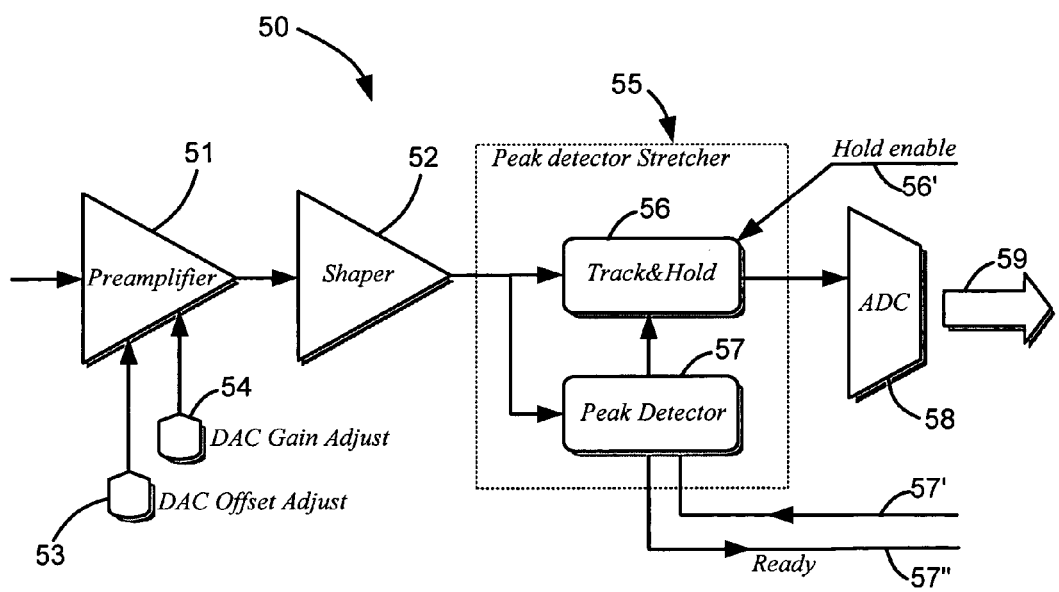
FIG. 4 is a schematic diagram of an exemplary analog chain utilized in the analog chain module of the present invention.

FIG. 4 is a schematic diagram showing the detailed operation of an exemplary analog chain 50 used in the analog chain block 12 of FIG. 1. In particular, the analog chain 50 is the standard radiation detector chain known in the art. The analog chain integrates the charges coming from the detector (not shown) and shapes it, as indicated by preamplifier 51 and shaper 52. The raw data from the shaper is then sent to a peak detector stretcher 55 where a peak detector circuit 57 finds the peak and holds a track-and-hold circuit 56 so that the peak value can be recorded through the ADC 58. Once the ADC data has been processed, it is sent to the FPGA at arrow 59, and the reset line 57' is used to release the track-and-hold/peak detector circuits. An enable control line 56' can be used to keep the track-and-hold circuit 56 tracking and therefore can digitize the raw data coming from the shaper for further digital processing. The preamplifier 51 has a programmable gain in order to adapt the MCA to various PMT performances. In this regard, a digital-to-analog converter (DAC) gain adjust 54 is used to adjust the gain on the preamplifier. A DAC offset adjust is also shown provided at 53. A third stage adjust (not shown) may also be implemented to adjust the ADC range at the output of the track-and-hold/peak detector stretcher 55.

Figure 5:
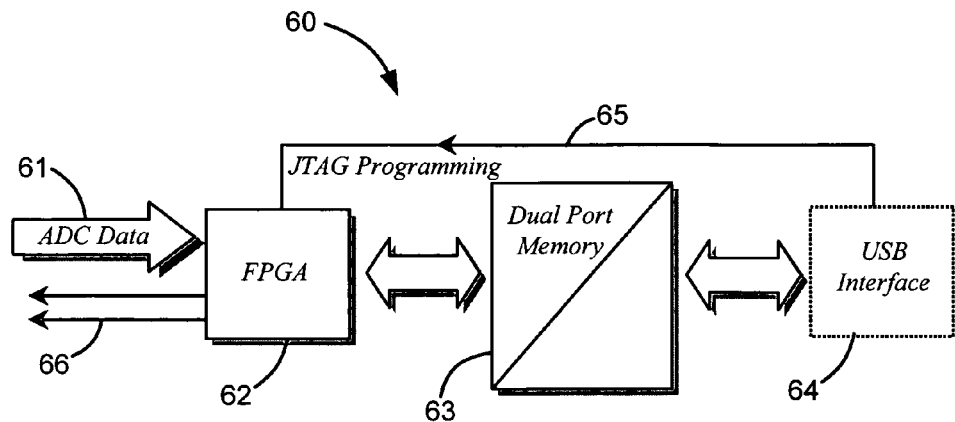
FIG. 5 is a schematic diagram of an exemplary processing/memory block of the present invention.

FIG. 5 is a schematic diagram showing the general operation 60 of the processing/memory and control/timing blocks. During operation of the MCA, data is received at the FPGA 62 from the ADC as indicated by arrow 61. The FPGA communicates with a dual port memory 63, which in turn is in communication with the USB interface 64, i.e. the USB controller and plug (not shown). Furthermore, the MCA is programmable to configure the operating/detecting parameters (e.g. detection modality) to suit a particular detection scenario/application. In particular, an FPGA 62 is used as the configurable processor providing the flexibility necessary to meet the functionality, power, and speed requirements of a particular detection application. The FPGA 62 may be programmed to implement, for example, various detection modalities, including, list mode data collection of basic raw data, histogram mode with very small, user-customizable time bins, or both. In another example, a trigger algorithm may be programmed in the FPGA to notify when certain detection/identification parameters are satisfied. In any case, FPGA programming is shown at directional line 65 from the USB interface 64. In this manner, the resources of the MCA may be maximized so that the same hardware can handle different detector/acquisition real time schemes. The triggering algorithm or the data acquisition scheme can then be updated and modified on-the-fly by a host laptop, to create a versatile real-time instrument. The FPGA 62 also handles the timing signals controlling the analog section and the high voltage setting, as indicated by arrows 66, as well as the dual-port memory 65. It is appreciated that the FPGA may be programmed to automatically shift modes depending on the count rate, i.e. detection performance.

Figure 6:
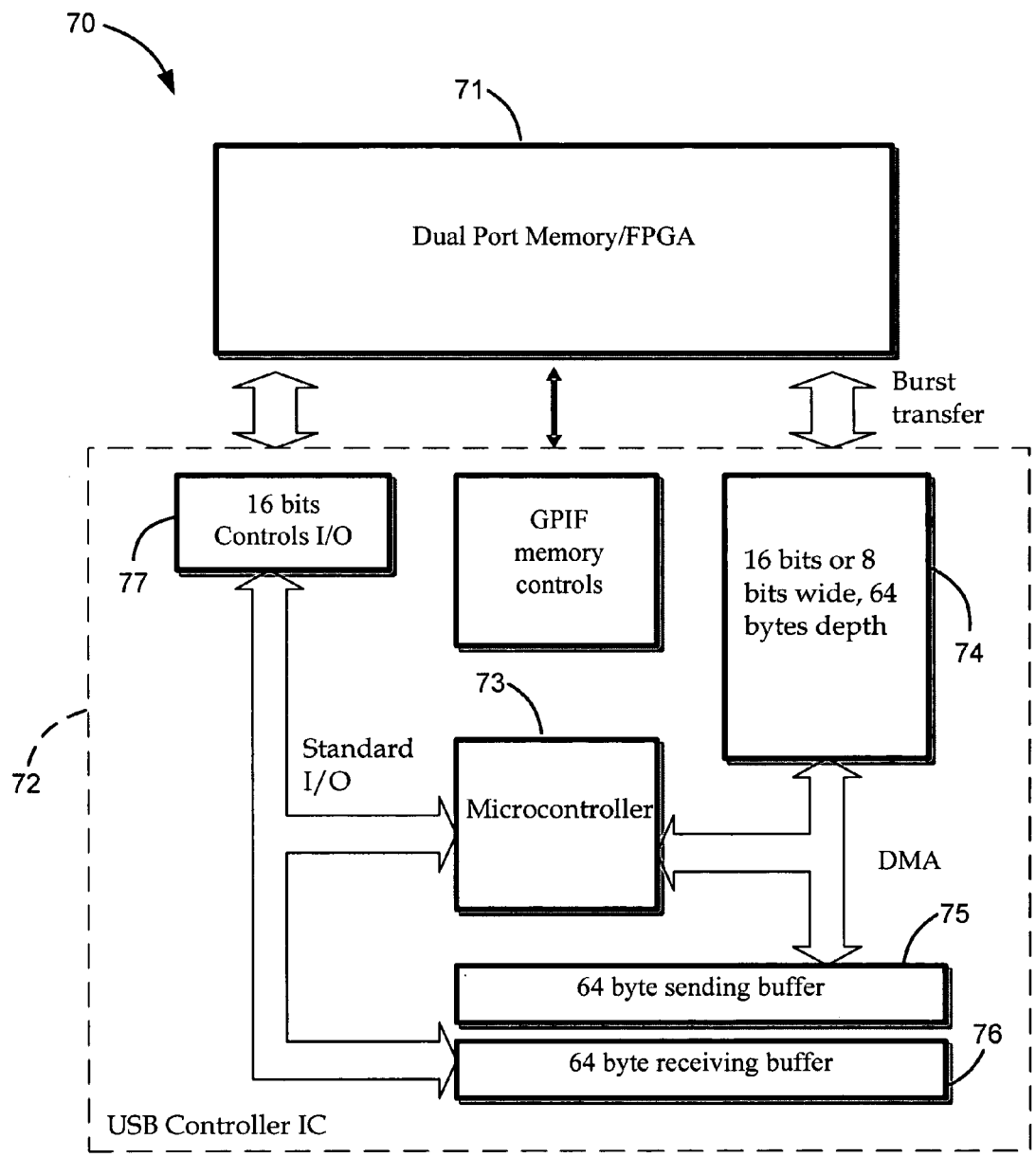
FIG. 6 is a schematic diagram of an exemplary USB interface operation of the present invention.

FIG. 6 is a schematic diagram of an exemplary USB interface operation of the present invention for communicating with an external host computer using an available USB interface standard, such as for example USB 1.1 or 2.0. The USB connection is preferably used for setup, monitoring, and on-the-fly programming of the radiation detector/ system utilizing the list mode MCA. The USB interface is designed to decode the various commands coming from the PC, program the FPGA through the standard JTAG interface, and read/clear the dual port memory content and send it to the PC. As particularly shown in FIG. 6, the USB interface transfers data from the dual-port memory 71 to the internal buffer FIFO 74 through word burst transfers. The FIFO then sends the data to the USB endpoint buffer 75 through internal DMA for maximum performances. The control lines are recovered from the receiving buffer 76 and latched to the according I/O control registers 77. The USB controller 72 may be interrupted upon memory condition and then a transfer may occur. From the USB standard standpoint, the interface will provide the following: read bulk endpoint for Dual port memory retrieval; write bulk endpoint for dual port memory preset (clear); write bulk endpoint for FPGA bit stream programming; read bulk endpoint for Status line readout; write bulk endpoint for Control line setup, and because USB in itself does not have interrupt capability, a work around may be used through host computer software interrupt in the driver stack and multi-threading on waiting calls.

Figure 7:
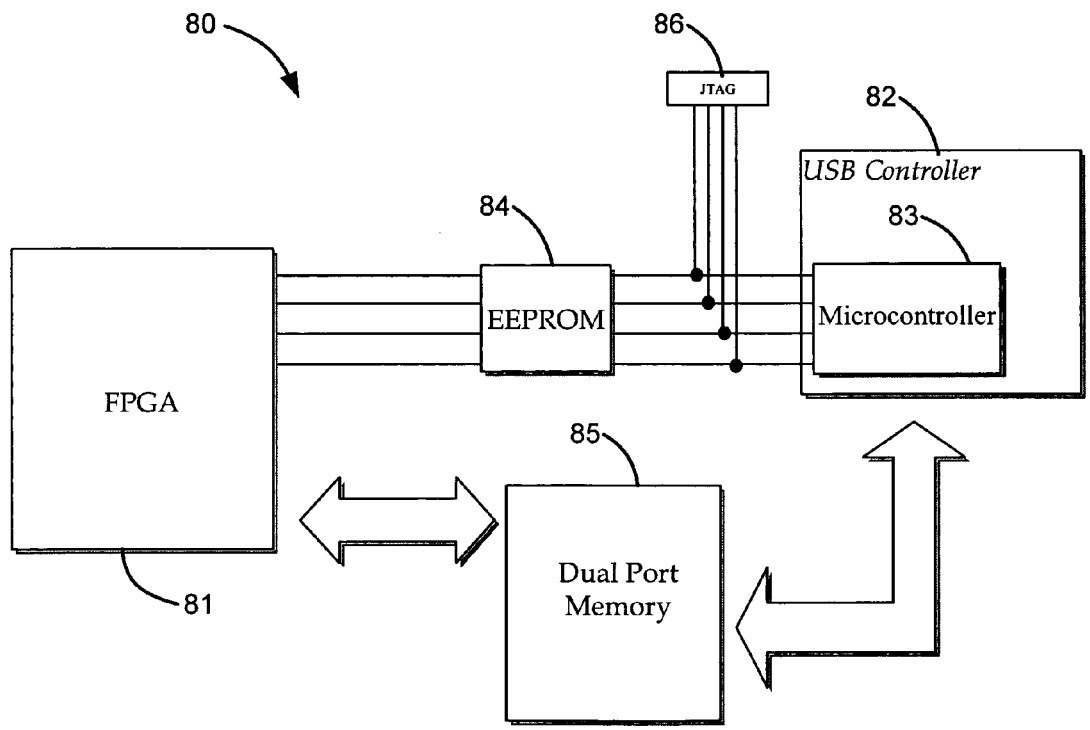
FIG. 7 is a schematic diagram of an exemplary in-system programming scheme of the present invention.

FIG. 7 shows a schematic diagram of the general architecture and operation flow of the in-system (i.e. "on the fly") FPGA programming scheme of the present invention. In particular, an FPGA-based module is used having a programmable FPGA 81 with a USB controller interface 82 that can be reprogrammed in-system from a host laptop. Operation of the USB controller 82 is enabled by the integrated micro-controller 83. The programming is preferably accomplished in one of three different ways: In a first conventional way, the EEPROM (electrically erasable programmable read-only memory), shown at 84, can be removed from its mounted socket and programmed in an external programmer (not shown). In a second conventional way, the four JTAG control pins/lines coming from the micro-controller 83 are tri-stated and the EEPROM 84 can be programmed through the JTAG interface and an external JTAG controller 86. And a third way involves using a micro-controller (e.g. from the host computer/laptop) 83 to toggle the four JTAG lines and program the EEPROM using a sequencing algorithm that enables programming through JTAG interface using a microcontroller. One such sequencing algorithm is available for licensing under the trademark, "8051 JAM byte code player" from Altera Corporation of San Jose, Calif. The actual binary file to be programmed is accessed through the USB interface. The availability of these three methods provides a choice to a user for system debugging. The micro-controller programming may also be monitored to determine if it was properly done by reading the EEPROM back in order to check its content and matching it with what would have been programmed through more conventional method. It is appreciated that one type of known micro-controller is, for example, the Intel 8051 micro-controller produced by Intel Corporation.

The MCA of the present invention preferably utilizes the third method for programming the EEPROM discussed above. JTAG programming via the micro-controller is a preferred method of programming the FPGA since it reduces the number of components used. It is appreciated that the JTAG interface is based on the IEEE Standard 1149.1, a standard known in the art for specifying how to control and monitor the pins of compliant devices on a printed circuit board. To implement this method, the first step is to create a file that can be used to program any device through JTAG. The advantage of performing such step is to be able to program any EEPROM or even CPLDs from any vendor without having to change this part of the design. The FPGA is first implemented in, for example, VHDL (i.e. very high speed integrated circuit (VHSIC) hardware description language) and synthesized. At the end of this process, a bit file is obtained, and the following exemplary subsequent sequence is performed:

1. Create a file (e.g. .mcs or .exo) required for programming the EEPROM as if through the external programmer.
2. Create the JTAG chain corresponding to the EEPROM(s) programming as if through an external JTAG controller.
3. Create a file (e.g. .svf) including EEPROM erase and EEPROM program.
4. Convert the .svf file to first a jam STAPL file.
5. Create a byte code version .jbc of the jam ASCII based file.
6. Create an Hexadecimal C-structure so that the OS program (e.g. Windows program) can transfer it to the driver and then to the USB controller for the micro-controller to process.

The USB controller 82 boots up with a default number of access point which is more than sufficient for the present application, such that the USB device need not be re-enumerated. In addition, a hardwired vendor specific command is provided to load the micro-controller code at will without disturbing the USB configuration. Because the program memory embedded in the USB controller may be limited, the regular operation data transfer code cannot reside in memory at the same time the sequencing algorithm code resides in memory. The driver will then be responsible for reloading the appropriate micro-controller code when reprogramming the FPGA to the Jam Byte Code Player machine code. This new code will then download the hexadecimal version of the .jbc code into the dual-port memory (not used by the FPGA here any more since we plan on reprogramming it) and then play it through the JTAG lines implemented by I/O port. Once the programming is complete the micro-controller will then reset the FPGA, which will hence be reprogrammed with the EEPROM new values. Then the windows driver will reload the regular data transfer program to the micro-controller. In this manner, and using minimal hardware by re-using in a different configuration, the FPGA and the MCA can be reprogrammed on-the-fly.

Figure 8:
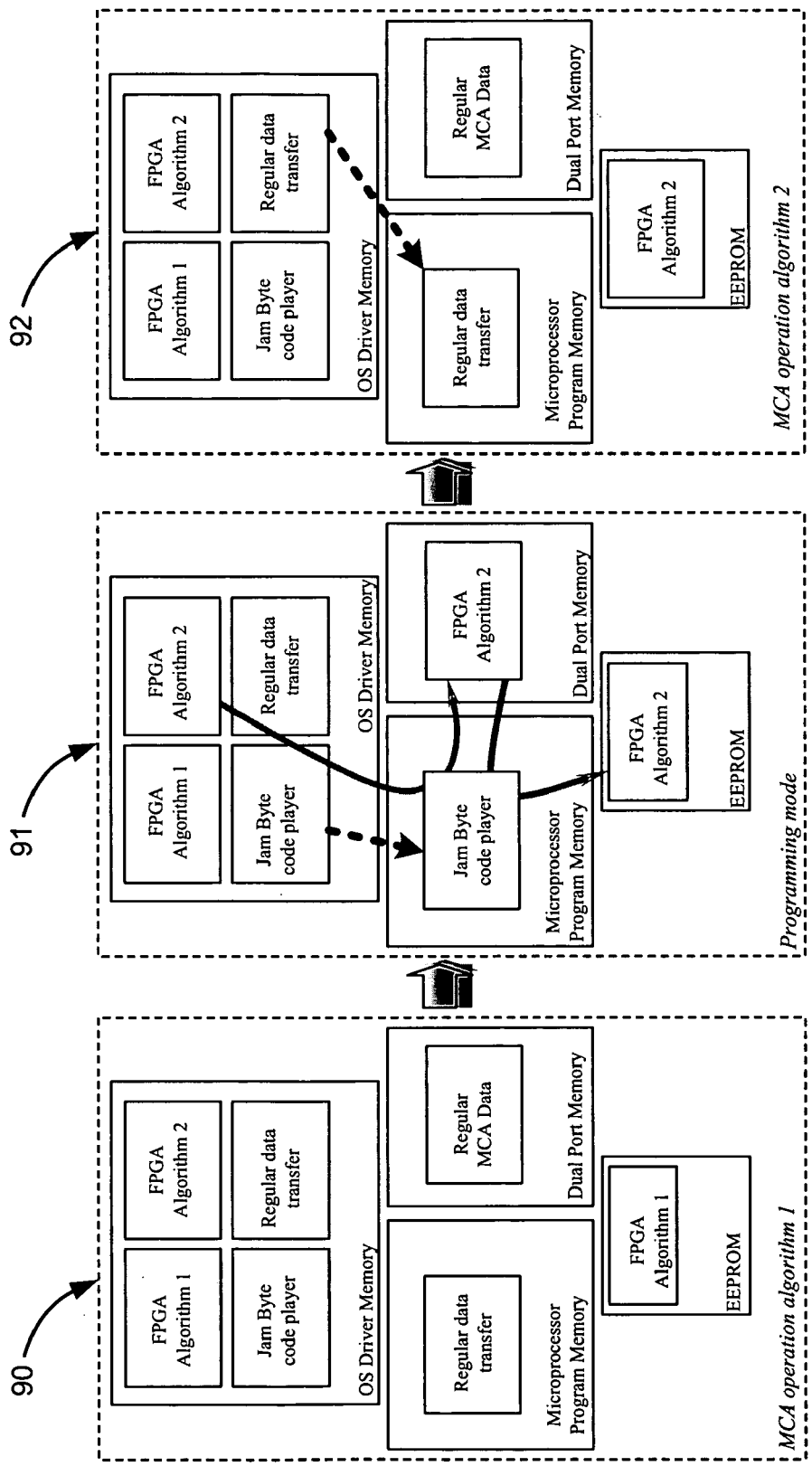
FIG. 8 is a schematic diagram of an exemplary in-system programming progression of the present invention.

FIG. 8 shows an illustration of the preceding discussion of in-system programming progress, and in particular the transition from a first algorithm 1 to a second algorithm 2. Reference character 90 shows MCA operation of algorithm 1 prior to programming. Reference character 91 shows the programming mode where the Jam Byte code player in the OS Driver Memory is loaded into the microprocessor program memory, and the FPGA algorithm 2 is loaded first into the dual port memory from the OS Driver Memory, and subsequently loaded into the EEPROM via the Microprocessor Program Memory. And reference character 92 shows the re-programmed MCA operation of algorithm 2.

In order to prevent conflict during programming, certain precautions must be taken at the FPGA level as well as at the EEPROM level. The EEPROM is designed to operate in a master serial mode so that the FPGA is the one that decides when to be reprogrammed. This enables access to the EEPROM without disturbing the FPGA. The FPGA will then be reset and it will re-initiate a boot-up sequence involving re-programming with the new algorithm. The FPGA must also have a USB controller controlled reset pin or Program pin access. And the algorithm must have a stop mode that disables any access made to the dual-port memory. In this case the programming sequence would proceed as follows:

1. Disable dual-port memory access from the FPGA on old algorithm. 2
2. Download the Jam Byte Code to dual-port memory (as explained in previous section).
3. Program EEPROM (as explained in previous section).
4. Reset FPGA so that it reconfigures itself with the new algorithm.
5. Clear dual port memory.
6. Enable Dual-port memory access from the FPGA on new algorithm.

It is notable that the access to the dual-port memory is only required if the intent is to improve the programming speed or to reduce the size of the Jam byte code player micro-controller executable. However, it is sufficient to simply program the EEPROM with data as it comes from the USB endpoint.

Figure 9:
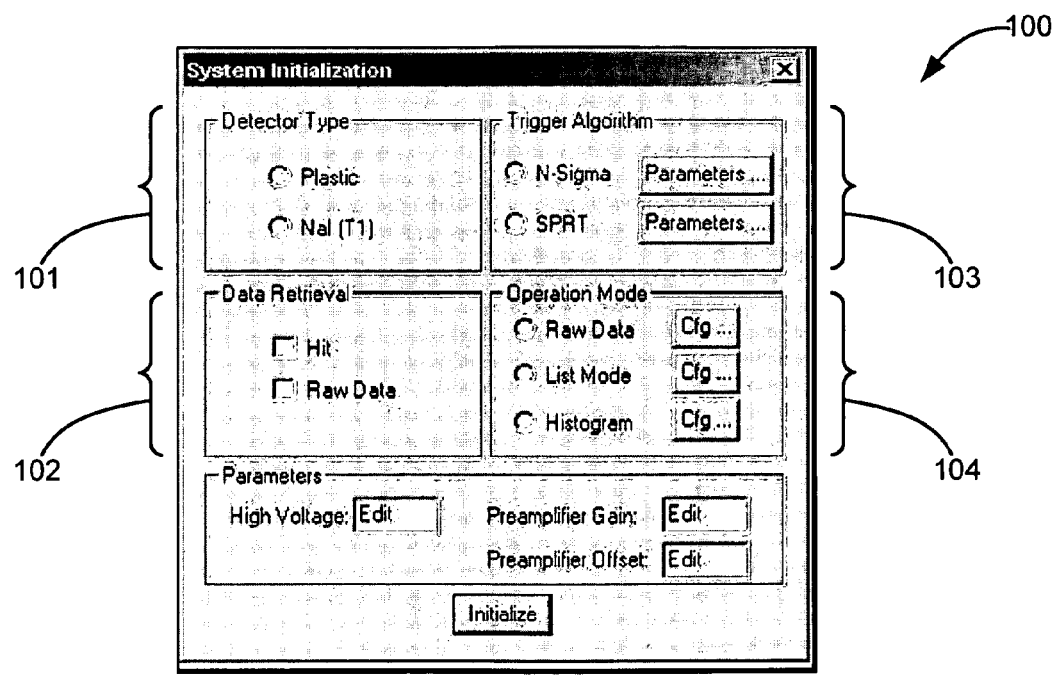
FIG. 9 is a screen shot of an exemplary visual interface for controlling the operation of the present invention.

For a typical situation, a user of the system would connect the system of the present invention to the detection hardware chosen for the task at hand, a NaI(T1) detector for example. If the instrument is set up properly the user only needs to turn the power on. If setup or modification is required, the user would connect a laptop or equivalent to the USB connector for equipment/system initialization according to user's preferences. Software is utilized to initialize, operate, and otherwise work with the list mode multichannel analyzer of the present invention. FIG. 9 shows an example of a visual user interface 100 (i.e. window), providing options for selecting operational/detection parameters. As shown, detector type can be chosen in box 101, data retrieval modality in box 102, trigger algorithm in box 103, and operation mode in box 104. Once the FPGA has been initialized and programmed, the user can leave the laptop attached to monitor the system, or disconnect the laptop and let the system run on its own. The radiation detector and MCA may be utilized as a standalone system, or used together with other radiation detector units in a larger radiation area monitoring system. As a portal monitor system, an 'alert monitor' would be desirable.

Figure 10:
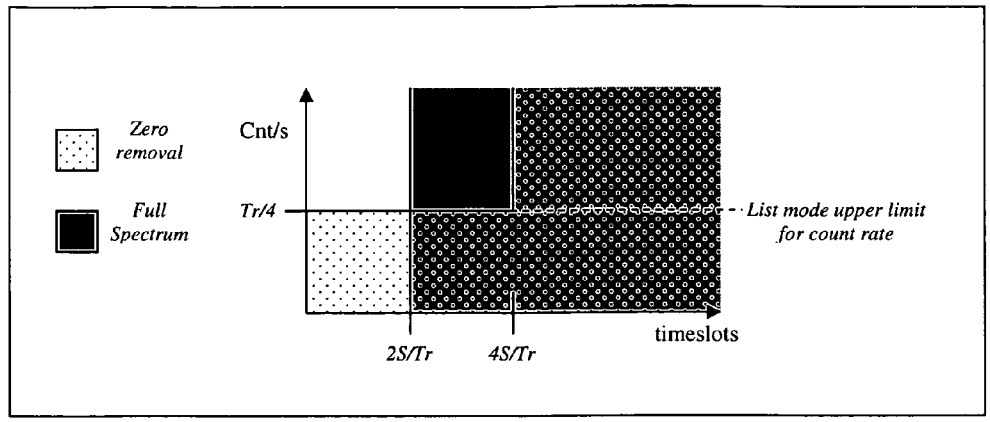
FIG. 10 is a graph showing the expected performances of three exemplary data transfer schemes.
Figure 11:
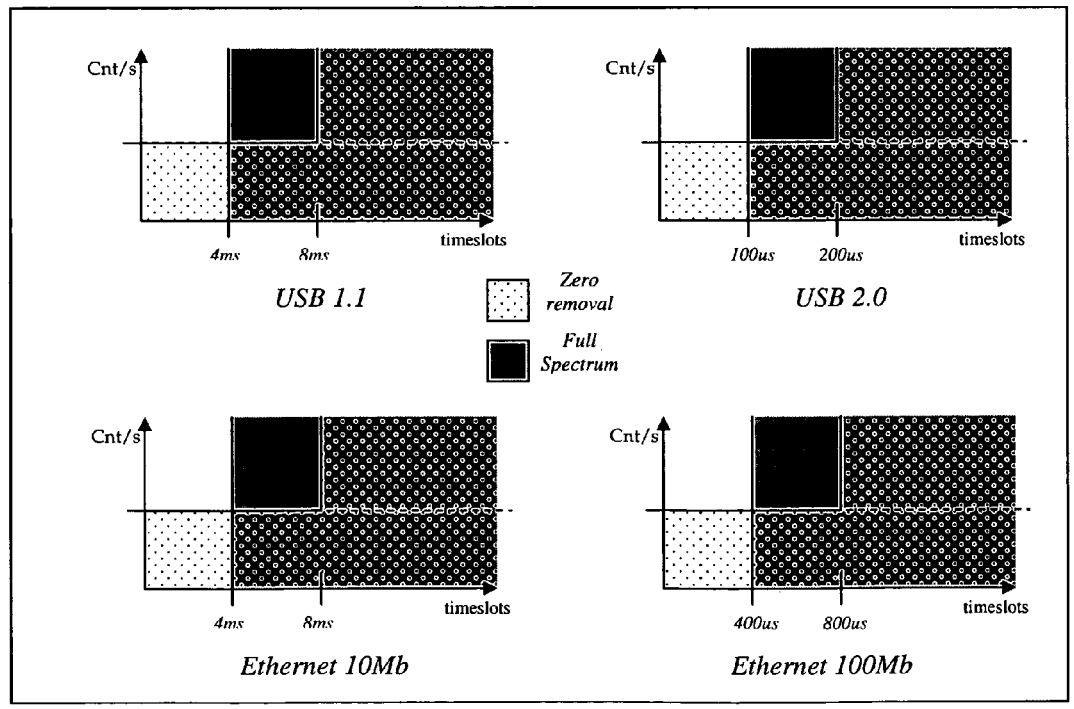
FIG. 11 is a graph showing the expected performances of the three exemplary data transfer schemes of FIG. 10, as applied to four different data transfer interfaces for comparison.

It is appreciated that the choice of detection modality (e.g. list mode, histogram mode, etc.) is dependent on the level of performance expected. In order to choose the best implementation dead time must be avoided and time resolution should be as small as possible. Since the transfer rate of the interface is generally the bottle-neck for such a system, three schemes for data transfer are discussed for illustrating levels of the performance which may be expected from the MCA of the present invention when these methods are used. The following are variable definitions used: $C_r$, is the expected counts per second from the detector; Timeslot, is the range of time slots considered; $T_r$, is the sustained transfer rate of the interface in Mbytes/S; and S, is the spectrum size. In all cases a 10 bits resolution, 16 bit depth histogram is assumed necessary for this illustration. (1) In list mode, each time a count is recorded, a timestamp and an energy are recorded to memory. The system can be configured to operate when, Tr>4.Cr. (2) In basic histogram mode, the full spectrum size is sent for each timeslot and therefore is independent from the count rate on the detector. In this case the system is configured to operate when Timeslot>2.S/Tr. (3) In zero-removal histogram scheme, the count rate is expected to be low enough so that for small timeslots (typically under 1 ms), a lot of zeros can be expected in the spectrum. In this case, a pair of values <Spectrum bin number; Spectrum bin Counts> is sent. For high count rates or large timeslots, efficiency is lost. But on the other hand, small timeslots with low count rates can be better handled. In this case the system is configured to operate when either, Timeslot>4.S/Tr, or Tr>4.Cr. The curves are shown in FIG. 10. And FIG. 11 shows various types of interfaces which may be utilized to compare performances by different data transfer interfaces, i.e. (1) USB 1.1, having a specification rate: 1 Mbytes/s, and an actual sustained rate: 0.5 Mbytes/s; (2) USB 2.0, having a specification rate: 40 Mbytes/s, and an actual sustained rate: 20 Mbytes/s; (3) Ethernet 10 Mbps having a specification rate: 1.25 Mbytes/s, and an actual sustained rate over TCP: 0.5 Mbytes/s; and (4) Ethernet 100 Mbps having a specification rate: 12.5 Mbytes/s and an actual sustained rate over TCP: 5 Mbytes/s. FIG. 11 summarizes the different performances reachable for the aforementioned interfaces. It is notable that if several systems are used in parallel, the counts rate axis must be proportionally decreased and the timeslot proportionally increased.

It is appreciated that the list mode MCA of the present invention can be used in a variety of radiation detectors for use in detection and tracking systems, portal monitors (pedestrian and/or vehicle; both static and dynamic); cargo facility radiation detection studies/work, general radiation detection. In particular, the present invention can be used in systems where detection/acquisition windows last less than 1 second, or where an active interrogation system is used (with a defined duty cycle) detecting delayed photons.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:

1. A standalone multichannel analyzer (MCA) for collecting and analyzing radiation data, comprising:
   a PMT connector for connecting to a photomultiplier tube (PMT) and a radiation detector;
   a power module having an on-board integrated high voltage power supply electrically connected to the PMT connector to supply power to the PMT and the radiation detector;
   an analog chain module including an on-board integrated preamplifier electrically connected to the PMT connector to receive, integrate, and shape charges collected at the PMT, and digitize the data; and
   a processor/controller module comprising an on-board integrated field-programmable gate array (FPGA) electrically connected to the analog chain module for performing either consecutive, uniform time binning of the digitized data in histogram mode or event recording in list mode, and an on-board integrated controller interface capable of enabling a user to customizably program said FPGA with a data processing preference of either list mode or histogram mode.

2. The MCA of claim 1,
   wherein the FPGA is further programmable via the integrated controller interface to make selections of at least one of detector type, data output preference, and trigger algorithm preference.

3. The MCA of claim 1,
   wherein the FPGA is programmable via the integrated controller interface using a Joint Test Action Group (JTAG) interface.

4. The MCA of claim 1,
   wherein the integrated controller interface is a universal serial bus (USB) interface.

5. The MCA of claim 1,
   wherein the FPGA is in-system programmable on-the-fly without any dead time.

6. The MCA of claim 5,
   wherein the processor/controller module further comprises a dual port memory capable of loading a second algorithm therein when programming out a first algorithm on-the-fly.

7. The MCA of claim 1,
   wherein the FPGA is capable of collecting data in uniform time bins less than 1 millisecond wide when operating in histogram mode.

8. The MCA of claim 1,
   wherein the list mode MCA has a modular construction with said modules adapted for individual removal and/or substitution.

9. The MCA of claim 1,
   wherein the analog chain module includes a preamplifier having a programmable gain in order to adapt to various PMT performances.

10. The MCA of claim 1,
    wherein the analog chain module includes a test port for providing test input to allow for instrument testing.

11. The MCA of claim 1,
    further comprising a standard 14 pin PMT connector electrically connected to a high voltage power supply of the power module, and electrically connected to a preamplifier of the analog chain module.

12. The MCA of claim 1,
    wherein the radiation detector is one of a NaI (t1) crystal and a plastic detector.

13. A multichannel analyzer (MCA) comprising:
    a digital data connector for connecting to a digital data device;
    a power module having an on-board integrated high voltage power supply electrically connected to the digital data connector to supply power to the digital data device; and
    a processor/controller module comprising an on-board integrated field programmable gate array (FPGA) for performing either consecutive, uniform time binning of digital data in histogram mode or event recording in list mode, an on-board integrated digital data input means electrically connected to the digital data connector for receiving digital data to be communicated directly to the FPGA, and an on-board integrated controller interface enabling a user to customizably program said FPGA with a data processing preference of either list mode or histogram mode.

14. The MCA of claim 13,
    wherein the digital data connector is a transistor-transistor logic (TTL) connector for receiving external inputs from TTL producing devices.

15. The MCA of claim 13,
wherein the FPGA is further programmable via the integrated controller interface to make selections of at least one of detector type, data output preference, and trigger algorithm preference.

16. The MCA of claim 13,
wherein the FPGA is programmable via the integrated controller interface using a Joint Test Action Group (JTAG) interface.

17. The MCA of claim 13,
wherein the integrated controller interface is a universal serial bus (USB) interface.

18. The MCA of claim 13,
wherein the FPGA is in-system programmable on-the-fly without any dead time.

19. The MCA of claim 18,
wherein the processor/controller module further comprises a dual port memory capable of loading a second algorithm therein when programming out a first algorithm on-the-fly.

20. The MCA of claim 13,
wherein the FPGA is capable of collecting data in uniform time bins less than 1 millisecond wide when operating in histogram mode.

21. The MCA of claim 13,
wherein the list mode MCA has a modular construction with said modules adapted for individual removal and/or substitution.

22. The MCA of claim 13,
further comprising a standard 14 pin PMT connector electrically connected to a high voltage power supply of the power module.

23. The MCA of claim 13,
wherein the radiation detector is one of a NaI (t1) crystal and a plastic detector.

* * * * *